(12) United States Patent
Wierer et al.

(10) Patent No.: US 9,196,788 B1
(45) Date of Patent: Nov. 24, 2015

(54) HIGH EXTRACTION EFFICIENCY ULTRAVIOLET LIGHT-EMITTING DIODE

(71) Applicant: Sandia Corporation, Albuquerque, NM (US)

(72) Inventors: Jonathan Wierer, Albuquerque, NM (US); Ines Montano, Albuquerque, NM (US); Andrew A. Allerman, Tijeras, NM (US)

(73) Assignee: SANDIA CORPORATION, Albuquerque, NM (US)

( * ) Notice: Subject to any disclaimer, the term of this patent is extended or adjusted under 35 U.S.C. 154(b) by 0 days.

(21) Appl. No.: 14/480,072

(22) Filed: Sep. 8, 2014

(51) Int. Cl.
*H01L 33/32* (2010.01)
*H01L 33/06* (2010.01)
*B82Y 20/00* (2011.01)

(52) U.S. Cl.
CPC ............... *H01L 33/06* (2013.01); *H01L 33/32* (2013.01); *B82Y 20/00* (2013.01); *Y10S 977/95* (2013.01)

(58) Field of Classification Search
CPC ..... H01L 33/32; H01L 33/06; H01L 33/0075; H01L 21/0254; H01L 33/007; H01L 33/30; H01L 29/2003; H01L 33/305; H01L 33/0045; H01L 33/0062
See application file for complete search history.

(56) References Cited

U.S. PATENT DOCUMENTS

2013/0181188 A1* 7/2013 Ooshika .................. 257/13

OTHER PUBLICATIONS

Krames, Michael R. et al., "Status and Future of High-Power Light-Emitting Diodes for Solid-State Lighting", Journal of Display Technology, (2007), pp. 160-175, vol. 3, No. 2.
Suzuki, Masakatsu et al., "First-principles calculations of effective-mass parameters of AlN and GaN", Physical Review B, (1995), pp. 8132-8139, vol. 52, No. 11.
Zhang, Jing et al., "Effect of crystal-field split-off hole and heavy-hole bands crossover on gain characteristics of high Al-content AlGaN quantum well lasers", Applied Physics Letters, (2010), pp. 111105-1-111105-3, vol. 97.
Chow, W.W. et al., "Laser gain properties of AlGaN quantum wells", Journal of Applied Physics, (2005), pp. 114502-114502-6, vol. 98.
Nam, K. B. et al., "Unique optical properties of AlGaN alloys and related ultraviolet emitters", Applied Physics Letters, (2004), pp. 5264-5266, vol. 84, No. 25.
Shakya, J. et al., "Polarization of III-nitride blue and ultraviolet light-emitting diodes", Applied Physics Letters, (2005), pp. 091107-1-091107-3, vol. 86.

(Continued)

*Primary Examiner* — Roy Potter
*Assistant Examiner* — Paul Patton
(74) *Attorney, Agent, or Firm* — Kevin W. Bieg

(57) ABSTRACT

Ultraviolet light-emitting diodes with tailored AlGaN quantum wells can achieve high extraction efficiency. For efficient bottom light extraction, parallel polarized light is preferred, because it propagates predominately perpendicular to the QW plane and into the typical and more efficient light escape cones. This is favored over perpendicular polarized light that propagates along the QW plane which requires multiple, lossy bounces before extraction. The thickness and carrier density of AlGaN QW layers have a strong influence on the valence subband structure, and the resulting optical polarization and light extraction of ultraviolet light-emitting diodes. At Al>0.3, thinner QW layers (<2.5 nm are preferred) result in light preferentially polarized parallel to the QW plane. Also, active regions consisting of six or more QWs, to reduce carrier density, and with thin barriers, to efficiently inject carriers in all the QWs, are preferred.

14 Claims, 12 Drawing Sheets

(56) References Cited

OTHER PUBLICATIONS

Kawanishi, Hideo et al., "Extremely weak surface emission from (0001) c-plane AlGaN multiple quantum well structure in deep-ultraviolet spectral region", Applied Physics Letters, (2006), pp. 081121-1-081121-3, vol. 89.

Taniyasu, Yoshitaka et al., "Radiation and polarization properties of free-exciton emission from AlN (0001) surface", Applied Physics Letters, (2007), pp. 261911-1-261911-3, vol. 90.

Kolbe, Tim et al., "Optical polarization characteristics of ultraviolet (In)(Al)GaN multiple quantum well light emitting diodes", Applied Physics Letters, (2010), pp. 171105-1-171105-3, vol. 97.

Wieczorek, S. et al., "Analysis of optical emission from high-aluminum AlGaN quantum-well structures", Applied Physics Letters, (2004), pp. 4899-4901, vol. 84, No. 24.

Banal, R. G. et al., "Optical anisotropy in [0001]-oriented $Al_xGa_{1-x}N$/AlN quantum wells (x>0.69)", Physical Review B, (2009), pp. 121308-1-121308-4, vol. 79.

Sharma, T.K. et al., "Strain-driven light-polarization switching in deep ultraviolet nitride emitters", Physical Review B, (2011), pp. 035305-1-035305-8. vol. 84.

Yamaguchi, A. Atsushi, "Valence band engineering for remarkable enhancement of surface emission in AlGaN deep-ultraviolet light emitting diodes", Physica Status Solidi C, (2008), pp. 2364-2366, vol. 5, No. 6.

Al Tahtamouni, T. M. et al., "Optical polarization in c-plane Al-rich $AlN/Al_xGa_{1-x}N$ single quantum wells", Applied Physics Letters, (2012), pp. 042103-1-042103-3, vol. 101.

* cited by examiner

HIGH EXTRACTION EFFICIENCY ULTRAVIOLET LIGHT-EMITTING DIODE

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to light-emitting diodes and, in particular, to an ultraviolet light-emitting diode with tailored AlGaN quantum wells enabling high extraction efficiency.

BACKGROUND OF THE INVENTION

Interest in AlGaN ultraviolet light-emitting diodes (UV-LEDs) is driven by applications such as water purification, bio-agent detection, and data storage. See A. Khan et al., *Nat. Photonics* 2, 77 (2008). Many challenges remain to achieve higher device efficiencies, including a better understanding of the variables that influence the polarization anisotropy of luminescence of AlGaN quantum wells (QWs) grown with c-plane orientation. The optical polarization is important because it determines the emission patterns within the AlGaN layers and therefore has a profound impact on the extraction efficiency of UVLEDs. Ideally, light emitted from AlGaN quantum wells would be completely polarized parallel to the QW plane because such light propagates predominately perpendicular to the QW plane, and into the typical and more efficient light escape cones. This is favored over light propagation along the growth plane which requires multiple and lossy bounces before extraction. Parallel polarized emission occurs in InGaN QWs, and results in extremely high light extraction efficiencies. See M. R. Krames et al., *J. Disp. Technol.* 3, 160 (2007). The optical polarization of AlGaN QWs, on the other hand, exhibits anisotropy and under certain conditions can also emit a percentage of the light polarized perpendicular to the QW plane. This light polarization propagates parallel to the QW plane and, as mentioned before, is more difficult to extract.

The strength and fraction of the two optical polarizations from the AlGaN QWs are determined by the complex structure of the valence band. The structure of the valence band is determined by many variables. Gaining a deeper understanding of these variables, and how they influence the valence band will result in better device designs for higher light extraction efficiency.

One major, and well-known, variable contributing to optical polarization is the Al composition of the AlGaN QW layers. Assuming all other variables are constant, as the Al mole fraction within the AlGaN alloy increases, the crystal-field split-off (CH) valence band eventually becomes the highest energy valence band (ground state), due to a negative crystal-field splitting, and the polarization shifts. See M. Suzuki et al., *Phys. Rev. B* 52, 8132 (1995); and W. W. Chow and M. Kneissl, *J. Appl. Phys.* 98, 114502 (2005). This energy cross-over of ground state valence bands occurs at Al compositions of ~0.6-0.8. See R. G. Banal et al., *Phys. Rev. B* 79, 121308 (2009); T. K. Sharma et al., *Phys. Rev. B* 84, 035305 (2011); and J. Zhang et al., *Appl. Phys. Lett.* 97, 111105 (2010). The light emission from this high-Al-content AlGaN layer is polarized perpendicular to the QW plane, and is, for the most part, trapped and lost within the AlGaN light-emitting diode (LED) layers because it is outside the typical light extraction cones for planar structures that are perpendicular to the QW plane. See W. W. Chow and M. Kneissl, *J. Appl. Phys.* 98, 114502 (2005); K. B. Nam et al., *Appl. Phys. Lett.* 84, 5264 (2004); J. Shakya et al., *Appl. Phys. Lett.* 86, 091107 (2005); H. Kawanishi et al., *Appl. Phys. Lett.* 89, 081121 (2006); Y. Taniyasu et al., *Appl. Phys. Lett.* 90, 261911 (2007); and T. Kolbe et al., *Appl. Phys. Lett.* 97, 171105 (2010). As a result, the light is trapped within the UVLED and absorbed by metal and lower bandgap layers (such as p-GaN).

Another factor that influences optical polarization is the strain of the QW relative to underlying substrate or template layers. The strain of the AlGaN layer can alter the critical Al composition where the optical polarization switches from parallel to perpendicular to the QW plane. The higher the compressive strain of the AlGaN layer, the higher the Al composition at which polarization switching occurs. See T. K. Sharma et al., *Phys. Rev. B* 84, 035305 (2011); and J. E. Northrup et al., *Appl. Phys. Lett.* 100, 021101 (2012). For growth of QWs compressively strained to AlN, the optical polarization switches to perpendicular to the QW plane at Al compositions greater than 0.80. See R. G. Banal et al., *Phys. Rev. B* 79, 121308 (2009); and T. K. Sharma et al., *Phys. Rev. B* 84, 035305 (2011). The Al composition where polarization switching occurs becomes lower as the AlGaN is relaxed so, in general, compressively strained AlGaN QWs are preferred for high light extraction. See J. E. Northrup et al., *Appl. Phys. Lett.* 100, 021101 (2012).

Quantum size effects, such as changes in QW thickness also affect optical polarization, although this is a less explored area. At a fixed strain, and at Al compositions (Al≥0.25) where the crystal-field split-off valence band is close enough in energy to the ground state to play a role, the optical polarization switches from parallel to perpendicular to the QW plane as the QW thickness increases. See R. G. Banal et al., *Phys. Rev. B* 79, 121308 (2009); T. K. Sharma et al., *Phys. Rev. B* 84, 035305 (2011); A. A. Yamaguchi, *Phys. Status Solidi C* 5, 2364 (2008); and T. M. Al Tahtamouni et al., *Appl. Phys. Lett.* 101, 042103 (2012). The QW thickness where this switching occurs shifts with strain, increasing in QW thickness with increased compressive strain. See T. M. Al Tahtamouni et al., *Appl. Phys. Lett.* 101, 042103 (2012). The reports of QW thickness dependence have been limited to theoretical or photoluminescence studies thus far, and at very high Al compositions. See A. A. Yamaguchi, *Phys. Status Solidi C* 5, 2364 (2008); T. M. Al Tahtamouni et al., *Appl. Phys. Lett.* 101, 042103 (2012); and H. M. Lu et al., *Opt. Express* 20, 27384 (2012). An inclusive experimental and theoretical study covering the effect of QW thickness on the optical polarization of electrically-injected UVLEDs has not yet been reported.

Carrier density can also play a role in the optical polarization. The influence of carrier density on polarization switching has been shown theoretically at high Al compositions (Al~0.7-0.9). See S. H. Park and J. I. Shim, *Appl. Phys. Lett.* 102, 221109 (2013). Such a trend, although not highlighted, was also observed in a previous theoretical work for lower compositions (Al~0.39). See S. Wieczorek et al., *Appl. Phys. Lett.* 84, 4899 (2004). Experimental evidence of carrier density influencing optical polarization has yet been shown.

However, a need remains for an ultraviolet light-emitting diode wherein the composition, thickness, strain, and carrier density of the AlGaN quantum wells are tailored to enable high extraction efficiency.

SUMMARY OF THE INVENTION

The present invention is directed to an ultraviolet light-emitting diode, comprising a p-type structure comprised of AlGaN layers and an n-type structure comprised of AlGaN layers to form a p-n junction, and a multiplicity of quantum wells disposed between the p- and n-type structures, wherein each quantum well comprises an AlGaN quantum well layer sandwiched between opposing AlGaN barrier layers, and wherein the Al composition of the quantum well layers is sufficiently high, the quantum well layers are sufficiently compressively strained, the quantum well layers are sufficiently thin, and the carrier density is sufficiently low such that the multiple quantum wells emit light with a degree of polarization that is sufficiently high so that it is preferentially polarized parallel to the plane of the quantum well layers. Preferably, the Al composition of the quantum well layers is greater than 0.3, the thickness of the quantum well layers is less than 2.5 nm, the multiplicity of quantum wells are compressively strained greater than 70% to AlN, and the multiplicity of quantum wells comprises six or more quantum wells so that the degree of polarization is greater than 0.3.

As an example of the invention, an ultraviolet-emitting (270-280 nm) multiple quantum well heterostructure consisting of 3 periods of $Al_{0.44}Ga_{0.56}N/Al_{0.55}Ga_{0.45}N$ with individual layer thicknesses between 2-3.2 nm was studied both experimentally and theoretically. The optical polarization changed to preferentially polarized perpendicular to the QW plane as the QW thickness increased or the carrier density increased. Calculations indicate that these trends are due to a) a larger decrease in overlap of conduction band to light and heavy hole envelope functions compared to crystal-field split-off envelope functions, and b) coupling between the valence subbands where higher heavy hole subbands couple to lower light hole and crystal-field split-off subbands. These changes in the valence band have a profound effect on the optical polarization, emission patterns, and eventual light extraction for ultraviolet emitters at these compositions and thicknesses, and need to be controlled to ensure high device efficiency. In particular, MQW designs with thinner and numerous quantum wells for decreased carrier density are preferred, keeping in mind the constraints of the carrier diffusion and drift lengths to populate the QWs.

BRIEF DESCRIPTION OF THE DRAWINGS

The detailed description will refer to the following drawings, wherein like elements are referred to by like numbers.

DETAILED DESCRIPTION OF THE INVENTION

Figure 1:
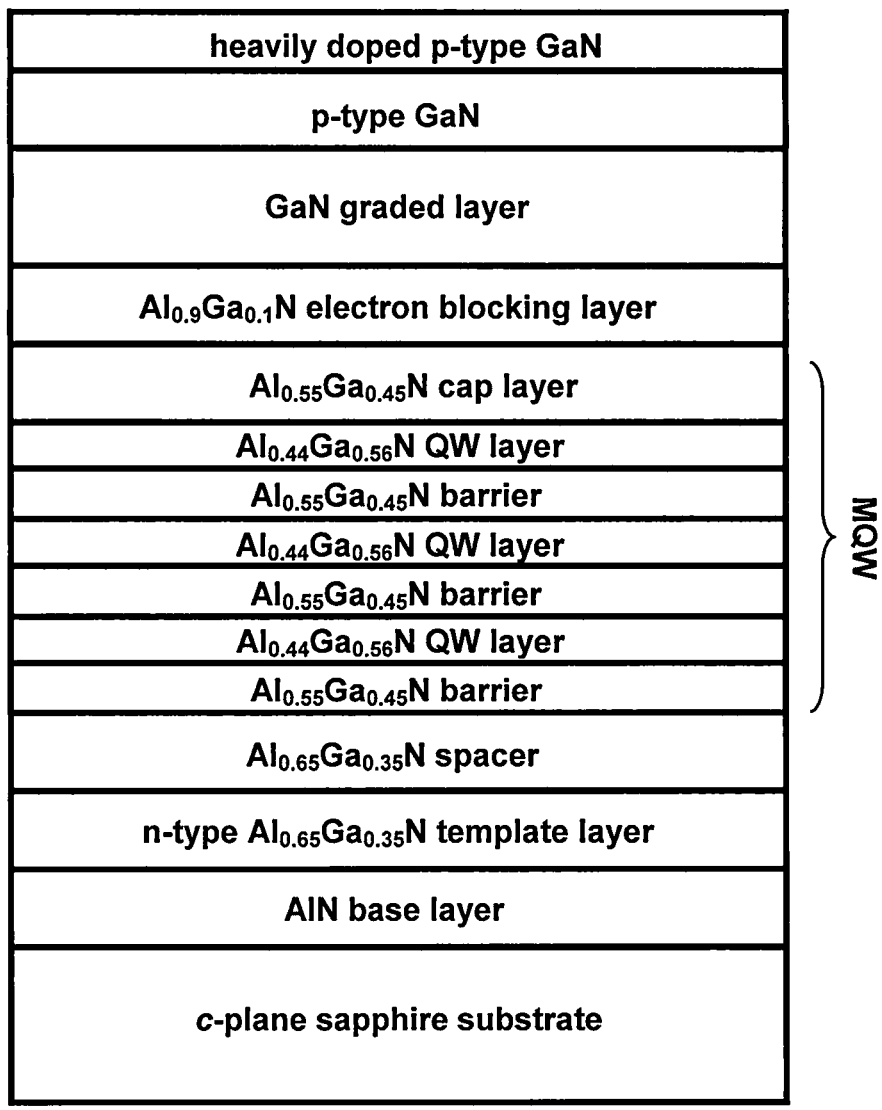
FIG. 1 shows a multiple-quantum-well heterostructure of an exemplary UVLED.

This invention relates to the design of c-plane AlGaN quantum wells (QWs) to achieve high extraction efficiency in ultraviolet light-emitting diodes (UVLEDs). (Here, AlGaN is understood to mean $Al_xGa_{1-x}N$, where x refers to the Al mole fraction or composition). The polarization of light emitted from AlGaN QWs consists of fractions of light polarized parallel and perpendicular to the QW plane. For efficient light extraction the parallel polarized light is preferred, because it propagates predominately perpendicular to the QW plane and into the typical and more efficient light escape cones. This is favored over perpendicular polarized light that propagates along the QW plane which requires multiple, lossy bounces before extraction. However, control of quantum well composition, thickness, strain, and carrier density is necessary to ensure favorable optical polarization and light extraction. There is interplay between the variables affecting optical polarization that needs to be considered. For example, thinner quantum wells provide more favorable optical polarization, but as the quantum wells are thinned the carrier density will increase due to less quantum well volume, which is unfavorable. Both variables need to be considered together to create a favorable optical polarization. In particular, the thickness and carrier density of AlGaN QW layers have a strong influence on the valence subband structure, and the resulting optical polarization and light extraction of ultraviolet light-emitting diodes. At Al>0.3, thinner QW layers (<2.5 nm are preferred) result in light preferentially polarized parallel to the QW plane. Also, active regions consisting of six or more QWs, to reduce carrier density, and with thin barriers, to efficiently inject carriers in all the QWs, are preferred. Additionally, strained quantum wells are preferred for sufficient energy separation of the crystal-field split-off hole subband from the other preferred light and heavy hole subbands. The quantum wells are preferably compressively strained greater than about 70% to AlN. This high level of compressive strain for the quantum wells is favorable for preferred optical polarization because it causes a greater energy separation of the crystal-field split-off hole (CH) subband from the other light and heavy hole (LH and HH) subbands, and reduces its participation in light generation. Reducing the CH subbands participation in light generation is preferred because transitions of carriers to a CH subband cause light to be polarized perpendicular to the quantum well plane that is difficult to extract, and therefore needs to be avoided.

The effect of QW thickness and carrier density on the optical polarization of an exemplary electrically injected UVLED is described below. The UVLEDs display a shift in optical polarization from parallel to perpendicular to the QW plane as the QW thickness or carrier density increases. These trends are confirmed by theoretical modeling, showing the shift in optical polarization is due to changes within the valence subbands. This includes shifts in envelope function overlap, and subband coupling of higher HH subbands to lower LH and CH subbands which affect the optical polarization, emission patterns, and light extraction efficiency of the UVLED. According to the present invention, it is preferable to control these variables to ensure high device efficiency.

Fabrication of Exemplary UVLED

As shown in FIG. 1, growth of the exemplary UVLEDs began with a 3 µm thick AlN base layer with a dislocation density of ~2-3×10$^9$ cm$^{-2}$ grown on c-plane sapphire substrate mis-oriented 0.2° toward the m-plane. Next, a ~1.8 µm thick, n-type (3×10$^{18}$ cm$^{-3}$) Al$_{0.65}$Ga$_{0.35}$N layer was grown to form a template for subsequent LED growth. X-ray diffraction measurements show that the Al$_{0.65}$Ga$_{0.35}$N was 78% compressively strained to the AlN layer and all subsequent layers have the same strain. The UVLED consisted of the n-type contact layer followed by an undoped spacer layers. Next, a 3 period MQW was grown consisting of QW and barrier layers of Al$_{0.44}$Ga$_{0.56}$N and Al$_{0.55}$Ga$_{0.45}$N, respectively. The thickness of the Al$_{0.44}$Ga$_{0.56}$N/Al$_{0.55}$Ga$_{0.45}$N multiple quantum wells (MQWs) varied across the wafer, induced by natural growth variations. Specifically, thickness variations across the wafer resulted in QW and barrier thicknesses that were 2.6±0.4 nm and 2.9±0.4 nm thick, respectively. These thickness variations were used to determine the effect of QW thickness on optical polarization. Based on separate calibration layers, the variations in strain and alloy compositions of the layers across the wafer were much smaller (less than 5% and 2 at. %, respectively) compared to the QW thickness variations, and therefore are considered to be nominally constant. Variation in epilayer thickness across the wafer was due to a slightly non-uniform distribution of the group-III alkyl source material. The barriers were Si-doped to achieve an electron concentration 1×10$^{18}$ cm$^{-3}$. Under electrical injection the MQW emitted light with a wavelength of ~275±5 nm that varied with MQW layer thickness. The MQW was followed by a ~13 nm Al$_{0.55}$Ga$_{0.45}$N cap layer. Finally, p-type layers were grown starting with a ~12 nm thick Al$_{0.9}$Ga$_{0.1}$N electron blocking layer that was compositionally graded up from the cap layer. Then a compositionally graded layer down to GaN was grown with a thickness of ~800 nm. Growth ended with a 350 nm thick p-type (5×10$^{17}$ cm$^{-3}$) GaN layer, followed by an 8 nm thick heavily doped (1×10$^{18}$ cm$^{-3}$) GaN layer for metal contacting.

Figure 2:
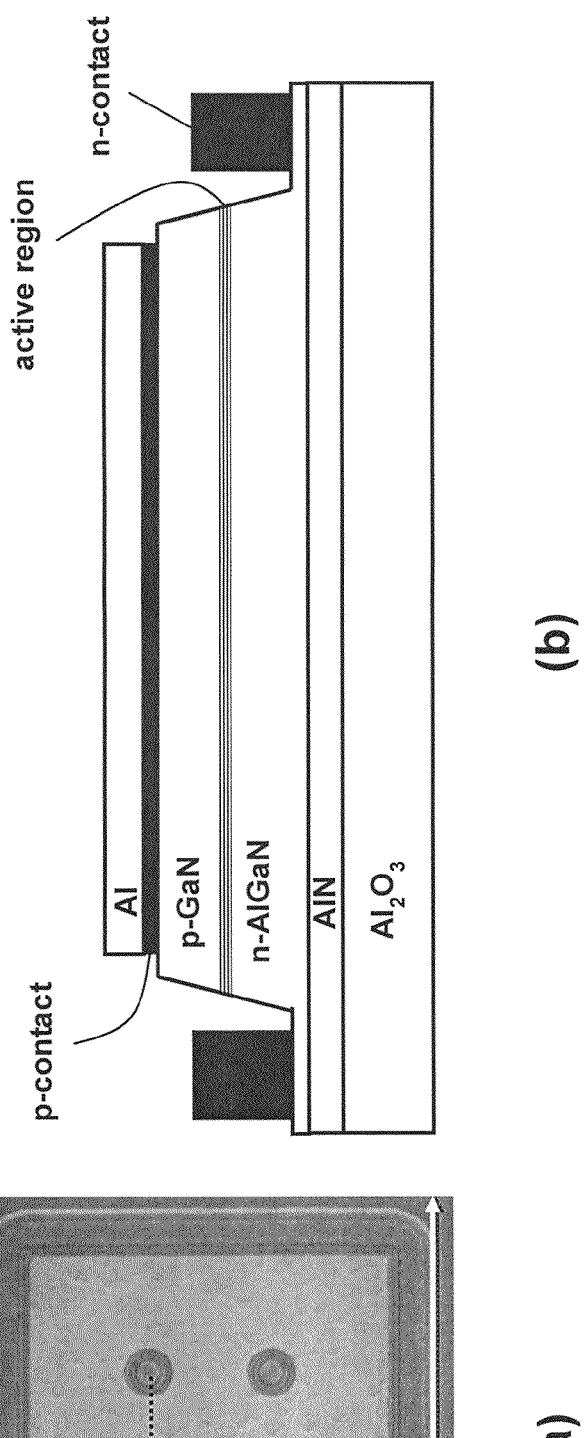
FIG. 2(a) is an optical microscope image of a ~275 nm AlGaN flip-chip LED taken through the substrate.
FIG. 2(b) is a schematic illustration of a cross-section of the AlGaN flip-chip LED between two of the n-contacts, as shown by the dashed line in FIG. 2(a).
Figure 3:
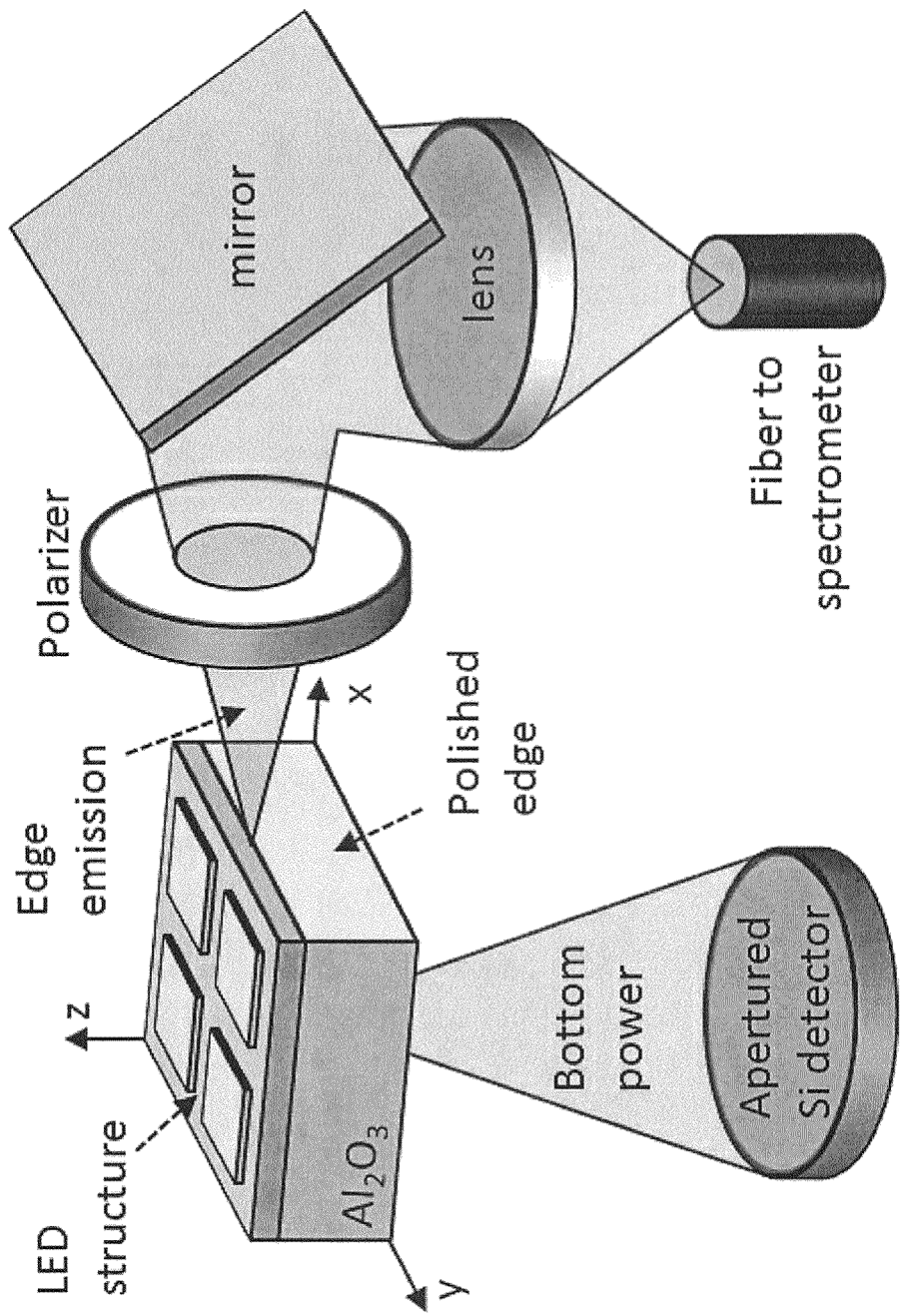
FIG. 3 is a schematic of the optical measurement system. The bottom emission is measured through the sapphire substrate of the UVLED into an apertured Si detector. The edge light is measured through an optical polarizer and eventually measured into a spectrometer.

The wafer was processed into UVLEDs that were intended to be flip-chipped on receiver substrates, but instead were measured after dicing. As shown in FIGS. 2(a) and 2(b), each device was ~0.3 mm×0.3 mm in area and had a reflective (opaque) p-contact consisting of a thin Ni-based contact layer covered by an Al reflector layer with a total contact area of ~0.079 mm$^2$. The n-contacts consisted of a ~20 µm wide trace on the periphery and four circular contacts. The circular n-contacts were ~20 µm in diameter on a 2×2 grid and spaced ~100 µm from one another in the center of the device. These separate n-contacts were connected over the p-contact using an inter-metal dielectric. This contacting scheme enabled effective current spreading within the n-type layers while maximizing the p-contact area. The backside of the sapphire wafer was lapped and polished, and then diced into 1×1 mm$^2$ chips containing four UVLED devices on a 2×2 grid, as shown in FIG. 3. The chips were polished on one edge to smooth out the roughness due to dicing for optical measurements. Although external quantum efficiency (EQE) was not measured for these UVLEDs, EQEs of similarly structured UVLEDs are limited to ~1% due to the thick absorbing p-GaN layers.

The UVLEDs were measured in two different ways in the optical measurement setup shown in FIG. 3, similar to previous experimental work. See T. Kolbe et al., *Appl. Phys. Lett.* 97, 171105 (2010). First, the power was measured out the bottom of the UVLED into a Si detector apertured to define a ~8° exit cone. Since the bottom is the preferred light extraction direction in planar flip-chip UVLEDs this measurement gives an indication of how much light can be extracted and the overall efficiency of the device. The second measurement was from the polished edge of the UVLED revealing the optical polarization of the internally generated light. The extracted edge light passed through an ultraviolet wire grid polarizer oriented either parallel or perpendicular to the QW plane, and then was reflected and focused into an optical fiber. This fiber was connected into a miniature spectrometer to measure the polarized spectra. Experimental data are presented as a degree of polarization (defined below) outside the UVLED.

Theory

The theoretical investigation consists of two parts. First is the calculation of the spontaneous emission spectrum and the resulting optical polarization of the AlGaN light-emitting layers taking into account spontaneous and piezoelectric polarization, the screening potential introduced by charged carriers, and many-body effects. See S. L. Chuang, *IEEE J. Quantum Elect.* 32, 1791 (1996); S. L. Chuang and C. S. Chang, *Phys. Rev. B* 54, 2491 (1996); W. W. Chow et al., *Appl. Phys. Lett.* 68, 296 (1996); S. H. Park et al., *IEEE J. Quantum Elect.* 43, 1175 (2007); and W. W. Chow and S. W. Koch, *Semiconductor-laser fundamentals: physics of the gain materials* (Springer, Berlin, N.Y., 1999). The band structure parameters used in the calculations are given in Table 1. This set of parameters was chosen to match the experimental trends, and consists of parameters from several publications. See I. Vurgaftman and J. R. Meyer, in *Nitride Semiconductor Devices: Principles and Simulations*, edited by J. Piprek (Wiley, New York, 2007), pp. 169; I. Vurgaftman et al., *J. Appl. Phys.* 89, 5815 (2001); and W. Bardyszewski and S. P. Lepkowski, *Phys. Rev. B* 85, 035318 (2012). The parameters of the AlGaN alloy are calculated using the bowing parameters given in *Nitride Semiconductor Devices: Principles and Simulations*. The calculation is performed using a modified form of a Schrödinger-Poisson solver initially developed for calculating intersubband transitions in III-V heterostructure devices and provides the spontaneous emission spectrum within the semiconductor layers. See I. Waldmueller et al., *IEEE J. Quantum Elect.* 46, 1414 (2010).

The second part of the theoretical investigation creates a mathematical transformation of the calculated spontaneous emission inside the AlGaN light emitting layers to the intensity outside the sample. This transformation is used to compare to the experimental trends.

Spontaneous Emission Spectrum

The spontaneous emission spectrum ($g_{sp,\hat{\in}}(\omega)$) of light propagating with wave vector $q=q(\sin(\theta)\cos(\phi), \sin(\theta)\sin(\phi), \cos(\theta))$, is defined as $$g_{sp,E_{\theta,\phi}}(\omega) = \sqrt{\frac{\mu_o}{\in}} \left(\frac{e^2}{m_o^2 \omega}\right) \sum_{\eta=\uparrow,\downarrow} \sum_{\sigma=U,L} \sum_{n,m} \int_0^{2\pi} d\phi \int_0^\infty dk_t \frac{k_t}{(2\pi)^2 L_w} \quad (1)$$

$$|E_{\theta,\phi} \cdot M_{nm}^{\eta\sigma}(k_t)|^2 f_n^C(k_t)[1 - f_{\sigma m}^V(k_t)] L(\omega, k_t)$$

where $\eta$ is the electron spin, w is the angular frequency, $\mu_0$ is the vacuum permeability, $\in$ is the dielectric constant, $$k_t = \sqrt{k_x^2 + k_y^2}$$

is me magnitude of the in-plane wave vector, $$\Phi = \tan^{-1}\left(\frac{k_x}{k_y}\right)$$

is the azimuthal angle in the $k_x$-$k_y$ plane, $L_{qw}$ is the quantum well thickness, $E_{\theta,\phi}$ is the polarization vector of the optical electric field, $f_l^C(k_t)$, $f_{\sigma m}^V(k_t)$ are the Fermi-Dirac distributions for electrons in the conduction and valence bands, and $L(\omega, k_t)$ is the line shape function renormalized by many-body effects. See S. H. Park et al., *IEEE J. Quantum Elect.* 43, 1175 (2007). $M_{nm}^{\eta\sigma}(k_t) = \langle \Psi_{m,k_t}^{V\sigma}|p|\Psi_{n,k_t}^{C\eta} \rangle$ is the momentum matrix element for transitions between the conduction band subband n and the upper/lower valence band subband m. The conduction and the upper/lower ($\sigma$=U,L) valence subband wave functions are given by $$\Psi_{n,k_t,\phi}^{C\eta} = \frac{e^{ik_t \cdot r_t}}{\sqrt{A}} \phi_n(z) |S, \eta\rangle \quad (2)$$

$$\Psi_{m,k_t,\phi}^{V\sigma}(z) = \frac{e^{ik_t \cdot r_t}}{\sqrt{A}} (g_m^{(\sigma_1)}(z, k_t)|\sigma_1\rangle + g_m^{(\sigma_2)}(z, k_t)|\sigma_2\rangle + \quad (3)$$

$$g_m^{(\sigma_B)}(z, k_t)|\sigma_3\rangle).$$

See S. L. Chuang, *IEEE J. Quantum Elect.* 32, 1791 (1996). Here $\phi_n(z)$ is the envelope function for the z-dependent part of the $n^{th}$ conduction subband, S is the zone-center wave function, $\eta$ is the electron spin, and $g_m^{(\sigma_i)}(z,k_t)$ are the envelope functions of the $m^{th}$ upper ($U_i$) or lower ($L_i$) valence subband with bases functions ($\sigma_i=U_i, L_i$)

$$|U_1\rangle = \frac{1}{\sqrt{4}} e^{-i\left(\frac{5\pi}{4}+\frac{s\phi}{2}\right)}|(X+iY)\uparrow\rangle + \frac{1}{\sqrt{4}} e^{i\left(\frac{5\pi}{4}+\frac{s\phi}{2}\right)}|(X-iY)\downarrow\rangle, \quad (4a)$$

$$|U_2\rangle = \frac{1}{\sqrt{4}} e^{i\left(\frac{\pi}{4}+\frac{\phi}{2}\right)}|(X-iY)\uparrow\rangle + \frac{1}{\sqrt{4}} e^{-i\left(\frac{\pi}{4}+\frac{\phi}{2}\right)}|(X+iY)\downarrow\rangle \quad (4b)$$

$$|U_3\rangle = \frac{1}{\sqrt{2}} e^{-i\left(\frac{\pi}{4}+\frac{\phi}{2}\right)}|Z\uparrow\rangle + \frac{1}{\sqrt{2}} e^{i\left(\frac{\pi}{4}+\frac{\phi}{2}\right)}|Z\downarrow\rangle, \quad (4c)$$

$$|L_1\rangle = \frac{1}{\sqrt{4}} e^{-i\left(\frac{5\pi}{4}+\frac{s\phi}{2}\right)}|(X+iY)\uparrow\rangle - \frac{1}{\sqrt{4}} e^{i\left(\frac{5\pi}{4}+\frac{s\phi}{2}\right)}|(X-iY)\downarrow\rangle, \quad (4d)$$

$$|L_2\rangle = \frac{1}{\sqrt{4}} e^{i\left(\frac{\pi}{4}+\frac{\phi}{2}\right)}|(X-iY)\uparrow\rangle - \frac{1}{\sqrt{4}} e^{-i\left(\frac{\pi}{4}+\frac{\phi}{2}\right)}|(X+iY)\downarrow\rangle, \quad (4e)$$

$$|L_3\rangle = -\frac{1}{\sqrt{2}} e^{-i\left(\frac{\pi}{4}+\frac{\phi}{2}\right)}|Z\uparrow\rangle + \frac{1}{\sqrt{4}} e^{-i\left(\frac{\pi}{4}+\frac{\phi}{2}\right)}|Z\downarrow\rangle \quad (4f)$$

See S. L. Chuang, *IEEE J. Quantum Elect.* 32, 1791 (1996). Equations (3) and (4) show the valence subband m has heavy hole (HH) character if $g_m^{(\sigma_1)}$ is the dominant envelope function, light hole (LH) character if $g_m^{(\sigma_2)}$ is the dominant envelope function, and crystal-field split-off (CH) character if $g_m^{(\sigma_3)}$ is the dominant envelope function.

The energies and wave functions are calculated by solving the effective-mass equations $$\left[-\frac{\hbar^2}{2}\left(\frac{k_t^2}{m_e^t} - i\partial_z \frac{1}{m_e^z(z)} \partial_z\right) + E_C^0(z) + P_{CE}(z) + ezF_E(z) + U(z)\right]\phi_n(z) = \quad (5)$$

$$E_n^C \phi_n(z)$$

for the conduction band and $$\Sigma_j(H^\sigma(k_p, -i\partial_z) + \delta_{ij}[E_V^0(z) + ezF_E(z) + U(z)])g_m^{(\sigma_j)}(z,k_t) = E_m^\sigma(k_t)g_m^{(\sigma_i)}(z,k_t) \quad (6)$$

for the valence band, respectively. In Eqs. (5) and (6), $E_C^0(z)$ denotes the unstrained conduction band edge, $E_V^0(z)$ the unstrained valence band edge, $P_{CE}(z)$ is hydrostatic energy shift in the conduction band, $F_E(z)$ is the internal electric field due to spontaneous and piezoelectric polarizations, and $U(z)$ is the Poisson potential due to carrier charges. See S. P. Lepkowski and J. A. Majewski, *Phys. Rev. B* 74, 035336 (2006). $H^\sigma$ denotes the upper ($\sigma$=U) or lower ($\sigma$=L) Hamiltonian. See S. L. Chuang, *IEEE J. Quantum Elect.* 32, 1791 (1996). The conduction and valence band structures and wave functions are obtained by iteratively solving the effective mass equations (using the ultimate concept approach; see R. Winkler and U. Rossler, Phys. Rev. B 48, 8918 (1993)) for $k_t$=0 to $k_t$=4 nm$^{-1}$ (in steps of 0.025 nm$^{-1}$) and Poisson's equation (using a predictor-corrector approach; see A. Trellakis et al., *J. Appl. Phys.* 81, 7880 (1997)).

Degree of Polarization

To determine the optical polarization of the emitted light and the resulting degree of polarization (defined below) the spontaneous emission spectrum is calculated for TE and TM polarized light, propagating with wave vector $q=q(\sin(\theta)\cos(\phi), \sin(\theta)\sin(\phi), \cos(\theta))$, with polarization vectors $$E_{\theta,\phi}^{TE} = \begin{pmatrix} \sin(\phi) \\ \cos(\phi) \\ 0 \end{pmatrix}, \quad (7)$$

$$E_{\theta,\phi}^{TM} = \begin{pmatrix} \cos(\theta)\cos(\phi) \\ \cos(\theta)\sin(\phi) \\ -\sin(\theta) \end{pmatrix}. \quad (8)$$

Figure 4:
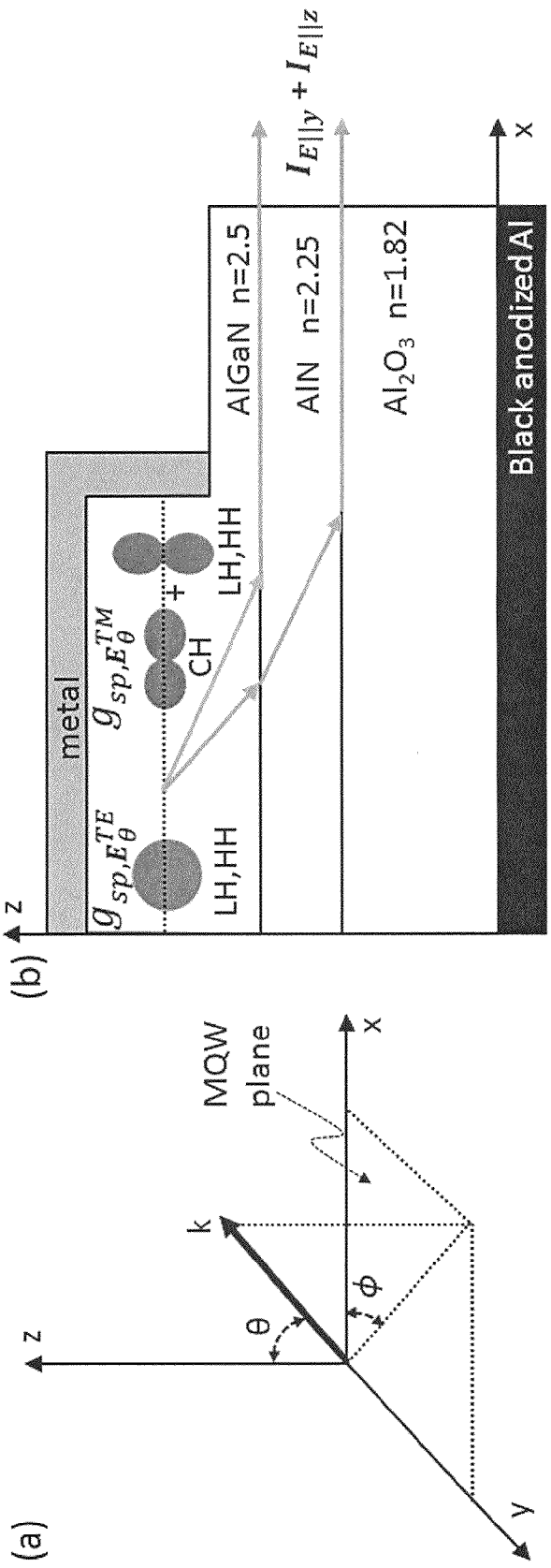
FIG. 4(a) shows the coordinate system for the emitted light.
FIG. 4(b) is an illustration of the geometry of the emission patterns and the UVLED structure. Light collected from the edge initiates from two angles within the UVLED. In the edge measurement the UVLED sits on a black anodized Al stage.

The coordinate system used is shown in FIG. 4(a). The corresponding matrix elements for electron spin $\eta=\uparrow$ (integrated over the azimuthal angle $\phi$) are obtained as:

$$\int_0^{2\pi} d\phi |E_{\theta,\phi}^{TE} \cdot M_{nm}^{\uparrow\sigma}(k_t,\phi)|^2 = \frac{\pi}{2}\left(\langle\phi_n|g_m^{(\sigma_1)}\rangle^2 + \langle\phi_n|g_m^{(\sigma_2)}\rangle^2\right)P_1, \quad (9)$$

$$\int_0^{2\pi} d\phi |E_{\theta,\phi}^{TE} \cdot M_{nm}^{\uparrow\sigma}(k_t,\phi)|^2 = \quad (10)$$

$$\frac{\pi}{2}\left(\langle\phi_n|g_m^{(\sigma_2)}\rangle^2 + \langle\phi_n|g_m^{(\sigma_2)}\rangle^2\right)P_1\cos(\theta)^2 + \pi\langle\phi_n|g_m^{(\sigma_3)}\rangle^2 P_2\sin(\theta)^2$$

where $P_1:=(S|p_x|X)^2=(S|p_y|Y)^2$ and $P_2:=(S|p_z|Z)^2$ denote the band-edge momentum matrix elements. See S. L. Chuang, *IEEE J. Quantum Electron.* 32, 1791 (1996). Similar expressions can be derived for electron spin $\eta=\downarrow$.

Inserting Eqs. (9) and (10) into Eq. (1) the spontaneous emission spectra of TE and TM polarized light propagating with wave vector q become $$g_{sp,E_{\theta,\phi}^{TE}}(\omega) = \quad (11)$$

$$\sqrt{\frac{\mu_o}{\epsilon}}\left(\frac{2e^2}{m_0^2\omega}\right)\sum_{\sigma=U,L}\sum_{n,m}\int_0^\infty dk_t \frac{k_t}{8\pi L_w}\left(\langle\phi_n|g_m^{(\sigma_1)}\rangle^2 + \langle\phi_n|g_m^{(\sigma_2)}\rangle^2\right)$$

$$P_1 f_n^C(k_t)[1-f_{\sigma m}^V(k_t)]L(\omega,k_t),$$

$$g_{sp,E_{\theta,\phi}^{TE}}(\omega) = \sqrt{\frac{\mu_o}{\epsilon}}\left(\frac{2e^2}{m_0^2\omega}\right) \quad (12)$$

$$\sum_{\sigma=U,L}\sum_{n,m}\int_0^\infty dk_t \frac{k_t}{4\pi L_W}\left\{\frac{1}{2}\left(\langle\phi_n|g_m^{(\sigma_1)}\rangle^2 + \langle\phi_n|g_m^{(\sigma_2)}\rangle^2\right)P_1\cos(\theta)^2 + \langle\phi_n|g_m^{(3)}\rangle^2 P_2\sin(\theta)^2\right\}f_n^C(k_t)[1-f_{\sigma m}^V(k_t)]L(\omega,k_t).$$

Equations (11) and (12) show the emission of TE polarized light is isotropic, whereas the emission of TM polarized light is anisotropic as shown in the schematic of FIG. 4(b).

Given the anisotropic nature of the TM light it is useful to reduce these equations to compare with experimental data. First, the emission of TM polarized light propagating parallel to the QW plane, i.e. $q=q(\cos(\phi),\sin(\phi),0)$, and polarized perpendicular to the QW plane, i.e. $E_{\theta=90\text{ o},\phi}^{TM}=z$, is found. This is the TM light collected from the edge of the UVLED and has the spontaneous emission spectrum $$g_{sp,E_{\theta=90,\phi}^{TM}}(\omega) \propto |z \cdot M_{nm}^{\uparrow\sigma}(k_t)|^2 f_n^C(k_t)[1-f_{\sigma m}^V(k_t)] \propto \langle\phi_n|g_m^{(\sigma_s)}\rangle^2 P_2 f_n^C(k_t)[1-f_{\sigma m}^V(k_t)]. \quad (13)$$

Emission of TM light propagating parallel to the QW plane thus depends strongly on the overlap of the envelope function of conduction subband n and the CH envelope function of valence subband m ($g_m^{(\sigma_s)}$) at in-plane wave vector $k_t$. Second, the emission of TM polarized light propagating perpendicular to the QW plane, i.e. q=qz, is polarized parallel to the QW plane, i.e. $E_{\theta=0\text{o},\phi}^{TM}=(\cos(\phi),\sin(\phi),0)$, is found. This is the TM light collected at the bottom of the UVLED. This light has the spontaneous emission spectrum $$g_{sp,E_{\theta=o,\phi}^{TM}}(\omega) \propto |y \cdot M_{nm}^{\uparrow\sigma}(k_t)|^2 f_n^C(k_t)[1-f_{\sigma m}^V(k_t)] \propto (\langle\phi_n|g_m^{(\sigma_1)}\rangle^2 + \langle\phi_n|g_m^{(\sigma_2)}\rangle^2)P_1 f_n^C(k_t)[1-f_{\sigma m}^V(k_t)] \quad (14)$$

and depends on the overlap of the envelope function of conduction subband n and the HH and LH envelope functions of valence subband m ($g_m^{(\sigma_1)}$ and $g_m^{(\sigma_2)}$) at the in-plane wave vector $k_t$. The latter (Eq. (14)) is the preferred propagation direction for UVLEDs because light propagation perpendicular to the QW plane need only travel a short distance before entering the light escape cone. For this reason, the extraction efficiency of UVLEDs is very sensitive to the internal emission pattern and optical polarization from the QWs.

To evaluate the changes in optical polarization (and emission patterns) the degree of polarization is used, defined as:

$$\rho_l = \frac{I_{E\|y} - I_{E\|z}}{I_{E\|y} + I_{E\|z}}, \quad (15)$$

where $I_{E\|y}$ and $I_{E\|z}$ denote the intensity of light polarized parallel and perpendicular to the QW plane. Highest extraction efficiency is achieved for a degree of polarization of 1, and lowest efficiency for −1. In order to compare the experimental to the theoretical optical polarization data the experimental setup has to be considered and is shown in FIG. 4(b). In the experiment, $I_{E\|y}$ and $I_{E\|z}$ are measured for light exiting the sample directly along the x-axis (in a ±4° cone). In order to simulate the measured light intensities outside the sample, the emission angle of the light exiting the AlGaN layers has to be determined. As depicted in FIG. 4(b), the light collected outside the sample originates only from two beams exiting the AlGaN layers. They are originally emitted downward at an angle, but are turned to $\theta=90°$ at the optical interfaces (critical angle). Other beams at the sapphire/air and AlGaN/air interfaces are lost due to metal absorption from the Al stage and metal layers, respectively. Light emitted directly at $\theta=90°$ from the QW cannot be collected because the metal covers the edge of the mesa. Also, light originally emitted upward is completely absorbed by the top p-GaN layer (not shown) so multiple bounced light cannot be collected. Using geometry and Snell's law the emission angle of the upper beam is $\theta_1=64.16°$, and the emission angle of the lower beam is $\theta_2=46.72°$. Since the spontaneous emission is proportional to the intensity of the light, the light intensities measured outside the sample are then obtained. For light traveling in the x direction and polarized in the y direction the intensity is $$I_{E\|y} \propto \int_{\theta_1-4°}^{\theta_1+4°} g_{sp,E_{\theta,\phi=0°}}^{TE} \sin(\theta)d\theta + \int_{\theta_2-4°}^{\theta_2+4°} g_{sp,E_{\theta,\phi=0°}}^{TE}\sin(\theta)d\theta, \quad (16)$$

while for light traveling in the x direction and polarized in the z direction the intensity is $$I_{E\|z} \propto \int_{\theta_1-4°}^{\theta_1+4°} g_{sp,E_{\theta,\phi=0°}}^{TM} \sin(\theta)d\theta + \int_{\theta_2-4°}^{\theta_2+4°} g_{sp,E_{\theta,\phi=0°}}^{TM}\sin(\theta)d\theta. \quad (17)$$

Both equations and are used to compare to the experimental data.

Analysis of Experimental Data

Figure 5:
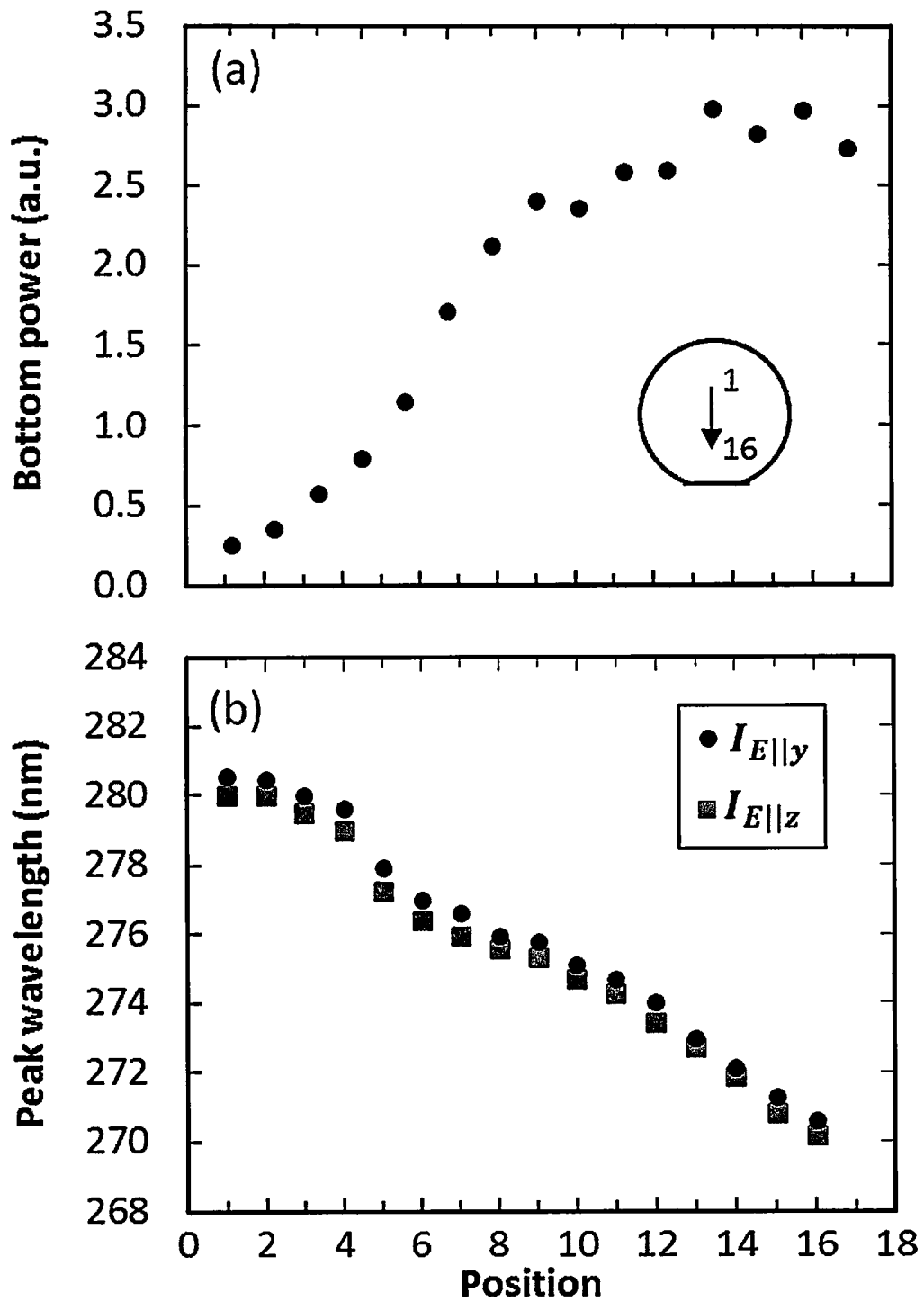
FIG. 5(a) is a graph of the bottom power and FIG. 5(b) is a graph of the peak wavelength (measured from the edge) versus position of the experimental data. The peak wavelength is measured for the two polarization directions.

The results of the optical polarization measurements are shown in FIG. 5. A column of 16 UVLEDs was measured near the center of the 2 in. diameter wafer (see inset of FIG. 5(a)), one die per 1 mm² chip at 10 mA. FIG. 5(a) shows the bottom power versus UVLED position (each position is ~1 mm apart). The bottom power increases dramatically as the UVLEDs are measured towards the top (position 1) to bottom (position 16) of the wafer as indicated in the inset of FIG. 5(a) (i.e., position 8 is near the exact center of the wafer). Other wafers with identical layer designs and thickness variations exhibit the same behavior (data not shown). Also, from the top to bottom positions the peak wavelength decreases as shown in FIG. 5(b). There is a slight difference in the peak wavelengths of the two polarizations, with $I_{E\|y}$ at slightly longer wavelengths. As described below, these two trends are due to the changes in the QW thickness, which leads to a change in valence band and the optical polarization.

Figure 6:
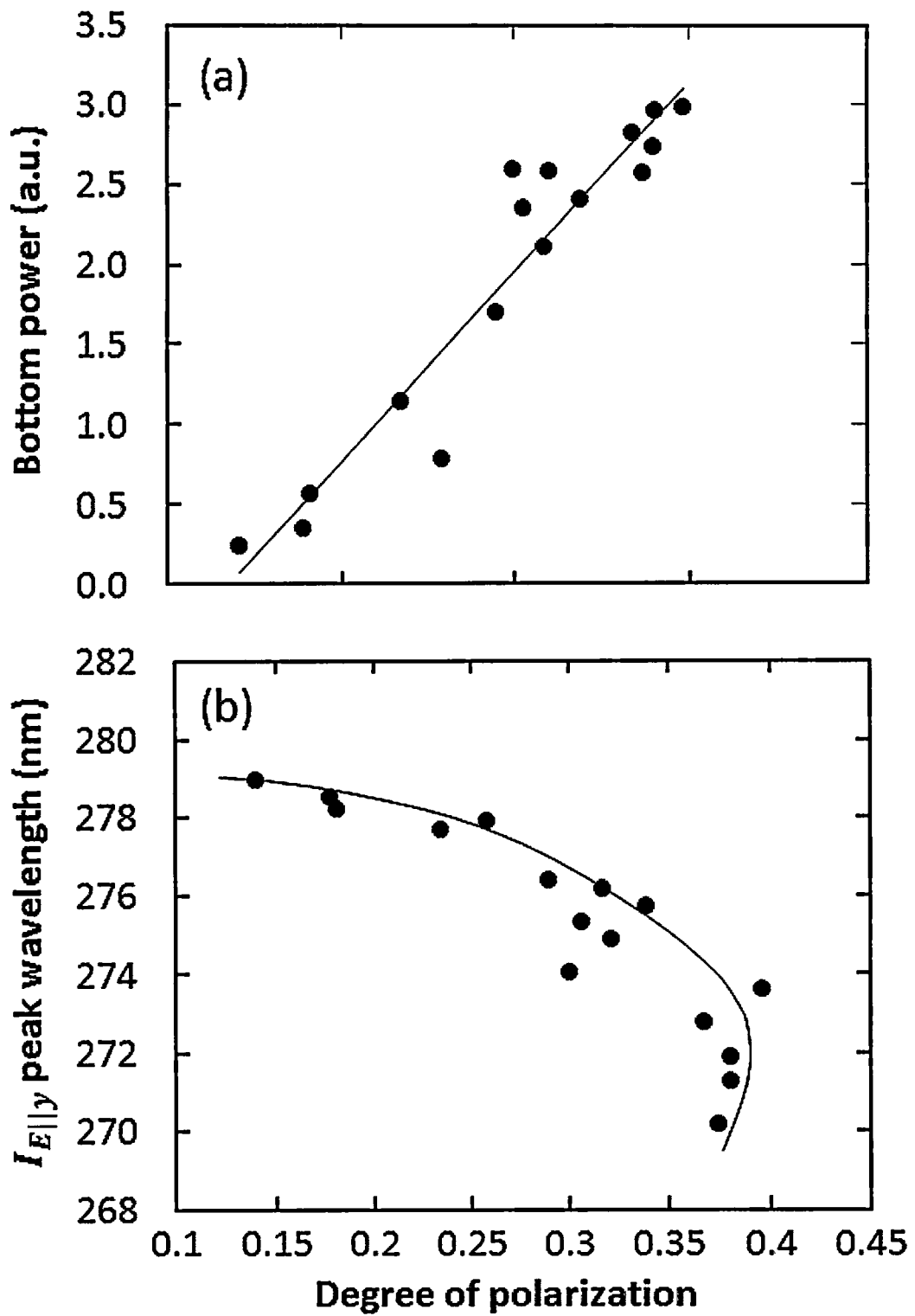
FIG. 6(a) is a graph of the bottom power and FIG. 6(b) is a graph of the y polarized peak wavelength (measured from the edge) versus degree of polarization of the experimental data. The lines are guides to the eye inspired by the theoretical modeling.

To confirm that this significant change in bottom power with position is a result of optical polarization changes, the bottom power versus the degree of polarization is plotted in FIG. 6(a). An increase in the bottom power is correlated with an increase in the degree of polarization. As the optical polarization of the edge light shifts from $I_{E\|z}$ to $I_{E\|y}$, the degree of polarization and bottom emission increases. This trend agrees with the internal emission patterns and escape cones illustrated in FIG. 4(b). The wavelength for light polarized in the y direction is also plotted versus the degree of polarization in FIG. 6(b), and the degree of polarization increases with decreased wavelength. This trend is opposite to what is expected in bulk AlGaN where increasing the Al composition decreases wavelengths and the degree of polarization. Therefore, Al composition is not the driving factor here, and another variable such as QW thickness must be the cause of the observed changes in optical polarization.

Figure 7:
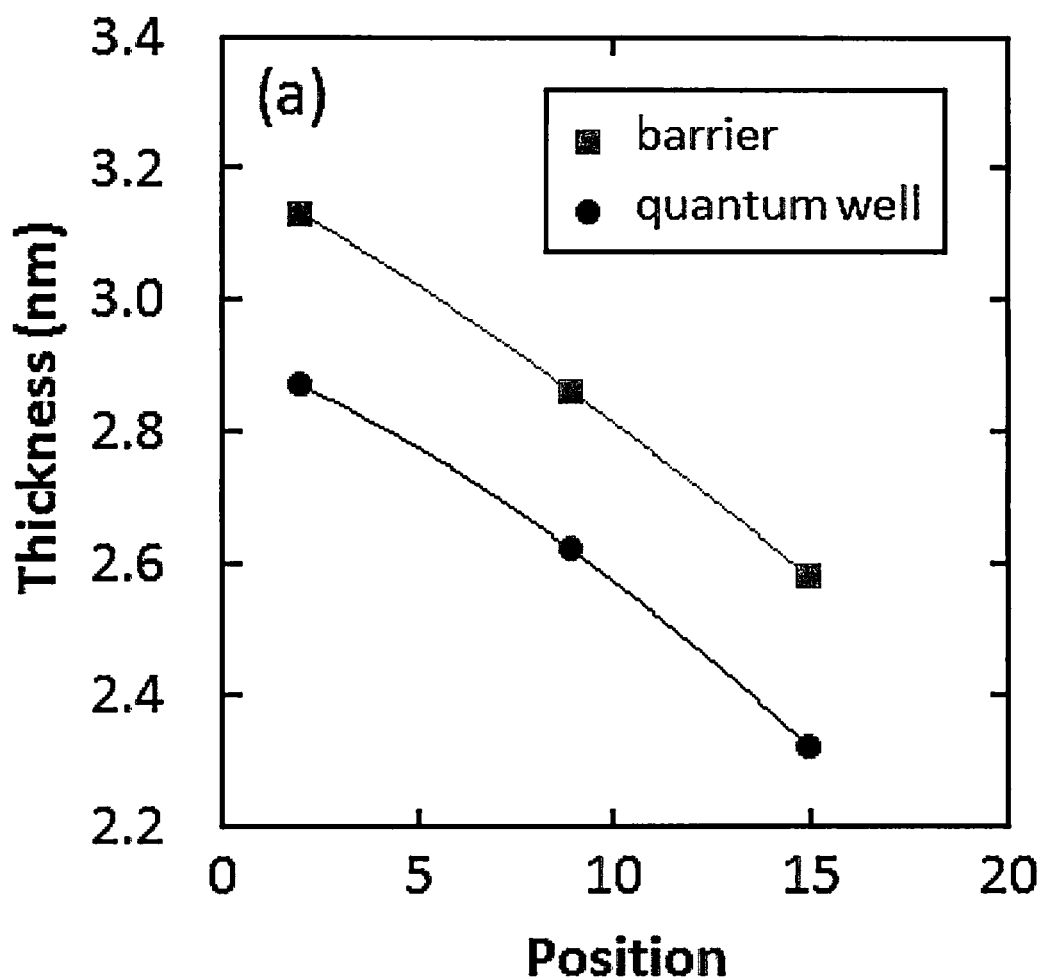
FIG. 7 is a graph of the quantum well and barrier thickness versus die position of the UVLEDs. A polynomial fit was used to determine the thickness for the unmeasured UVLEDs.

To determine if the QW thickness causes the observed change in optical polarization, scanning transmission electron microscopy (STEM) was performed on three UVLEDs at positions of 2, 9, and 15. Plots of quantum well thickness and barrier thickness as functions of position are shown in FIG. 7. Within this measured section, as the position increases the quantum well and barrier thicknesses decrease, which is due to natural and gradual growth variations from the top to the bottom of the wafer. This decrease in layer thickness explains the decrease in wavelength with increasing position (FIG. 5(b)) as the electronic states shift to higher (lower) energies in the quantum well conduction (valence) band. The quantum well and barrier thickness varies as a polynomial within this column of LEDs. Therefore, a polynomial fit is used to determine the QW thickness at all measured points.

Figure 8:
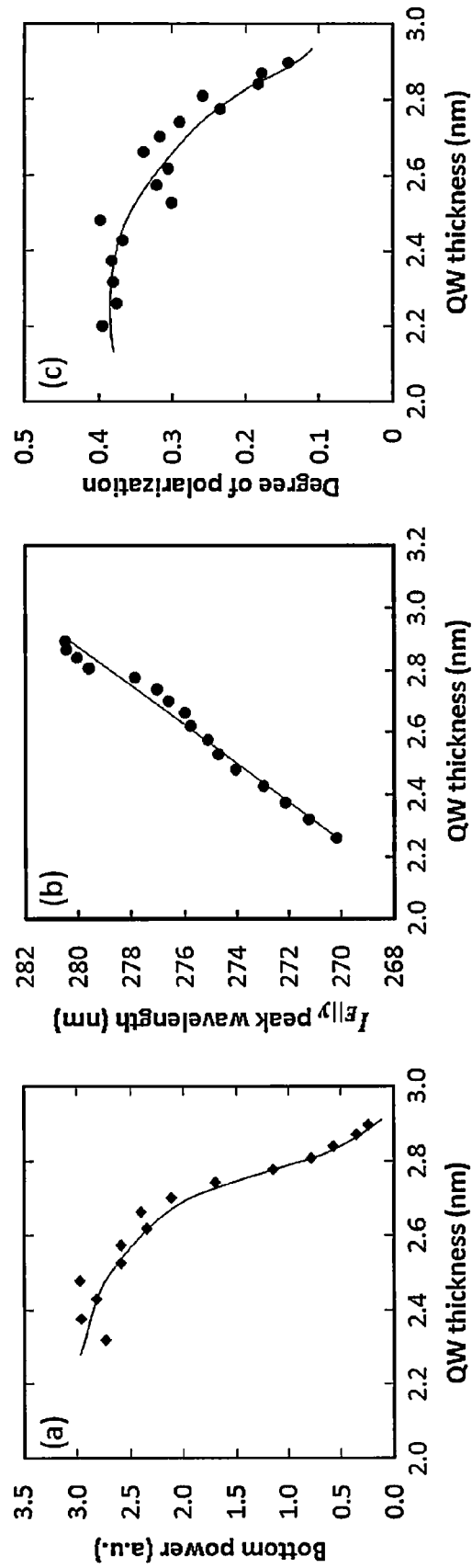
FIG. 8(a) is a graph of the bottom power.
FIG. 8(b) is a graph of the y polarized peak wavelength.
FIG. 8(c) is a graph of the degree of polarization versus quantum well thickness for the experimental data. The lines are guides to the eye inspired by the theoretical modeling.

In FIG. 8, the bottom power, wavelength, and degree of polarization are plotted as functions of QW thickness. FIG. 8(a) shows the bottom emission versus quantum well thickness. The bottom power increases with decreased quantum well thickness, greatest at the lowest measured thickness. The peak wavelength for $I_{E\|y}$ light is plotted versus quantum well thickness in FIG. 8(b). As expected, as the quantum well thickness increases, the peak wavelength increases due to shifting confinement of QW states. Also, the degree of polarization versus quantum well thickness is plotted in FIG. 8(c). As the quantum well thickness decreases, the degree of polarization increases. Clearly, the observed changes in bottom power, wavelength, and optical polarization are a result of changes in the QW thickness.

The experimental data indicate that quantum size effects (QW thickness) determine the optical polarization of the emitted light. Also, these data show thinner quantum wells are preferred for the preferred $I_{E\|y}$ light and improved light extraction. Therefore, precise targeting of the QW thicknesses is necessary to optimize polarization and maximize light extraction, because variations in QW thickness can lead to large variations in the extraction efficiency. For example, using the emission profiles given in Eqs. (11) and (12) and the geometrical considerations of FIG. 4(b), this AlGaN UVLED (unencapsulated) would have an extraction efficiency of ~10.5% if the emission were purely from HH and LH transitions while it would be only ~0.1% for purely CH transitions, assuming the use of a completely absorbing p-GaN layer. Further, based on other reports, it is expected that this thinner QW trend may be true for AlGaN quantum wells with high (>40%) Al compositions. See R. G. Banal et al., Phys. Rev. B 79, 121308 (2009); T. K. Sharma et al., Phys. Rev. B 84, 035305 (2011); A. A. Yamaguchi, Phys. Status Solidi C 5, 2364 (2008); and T. M. Al Tahtamouni et al., Appl. Phys. Lett. 101, 042103 (2012).

Figure 9:
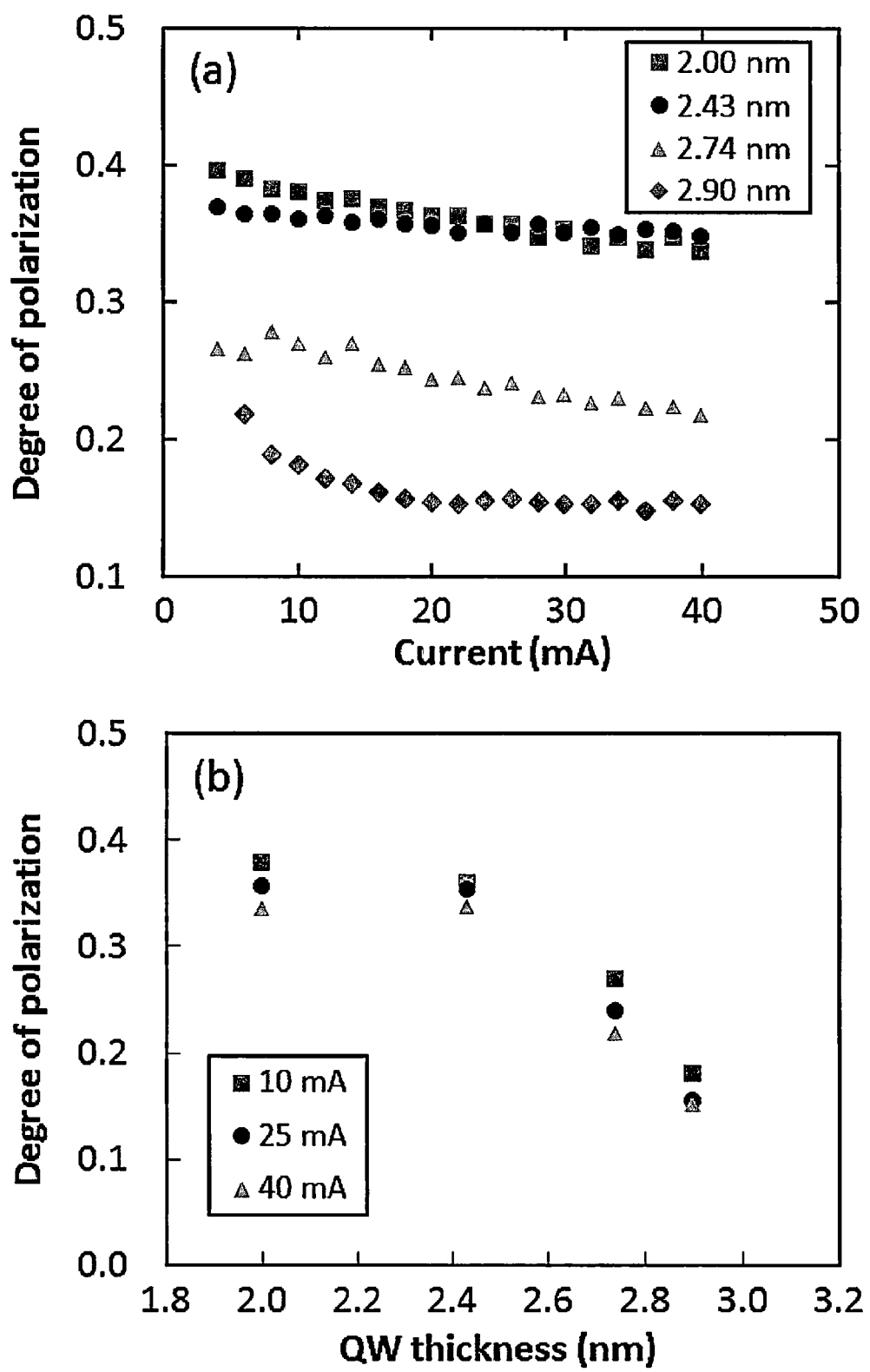
FIG. 9(a) is a graph of the degree of polarization versus current.
FIG. 9(b) is a graph of the degree of polarization versus quantum well thickness of the experimental data. Increases in current result in a lowering of the degree of polarization.

To understand if the degree of polarization depends on the carrier density, four different devices with different QW thicknesses were measured as a function of operating current (FIGS. 9(a) and (b)). The degree of polarization decreases with increased current regardless of QW thickness as shown in FIG. 9(a). At higher carrier densities the optical polarization shifts towards $I_{E\|z}$ polarized light (lower degree of polarization). This shift is smaller compared to the shift with QW thickness as shown in FIG. 9(b), but it is still a contributing factor. This clear experimental identification of a shift in optical polarization with current is important, because it shows extraction efficiency is a function of current. Therefore, one should expect a drop in external quantum efficiency with increased current that is partially due to this change in extraction efficiency when measuring UVLEDs. It is expected that this trend is also present in other AlGaN QWs with high Al compositions (>0.4).

To confirm that quantum-sized effects are influencing the optical polarization and to gain deeper understanding of the experimental results, the spontaneous emission spectrum was simulated for single QWs ($Al_{0.44}Ga_{0.56}N$) of various thicknesses surrounded by barriers ($Al_{0.55}Ga_{0.45}N$) of thickness $L_B$. QW and barrier widths were varied simultaneously to cover the range of $L_{QW}$: 1.6 to 4.0 nm and $L_B$: 1.9 to 4.3 nm to match the experimental data. The two-dimensional carrier density, $N_{2D}$, was varied between $1\times10^{12}$ and $4\times10^{12}$ cm$^{-2}$. The radiative and non-radiative recombination coefficients are unknown for this material so the exact calculation of carrier density to current is presently not possible, but they are proportional to each other. With this in mind, comparisons of experimental data to the calculated data relied on showing the same trends.

Figure 10:
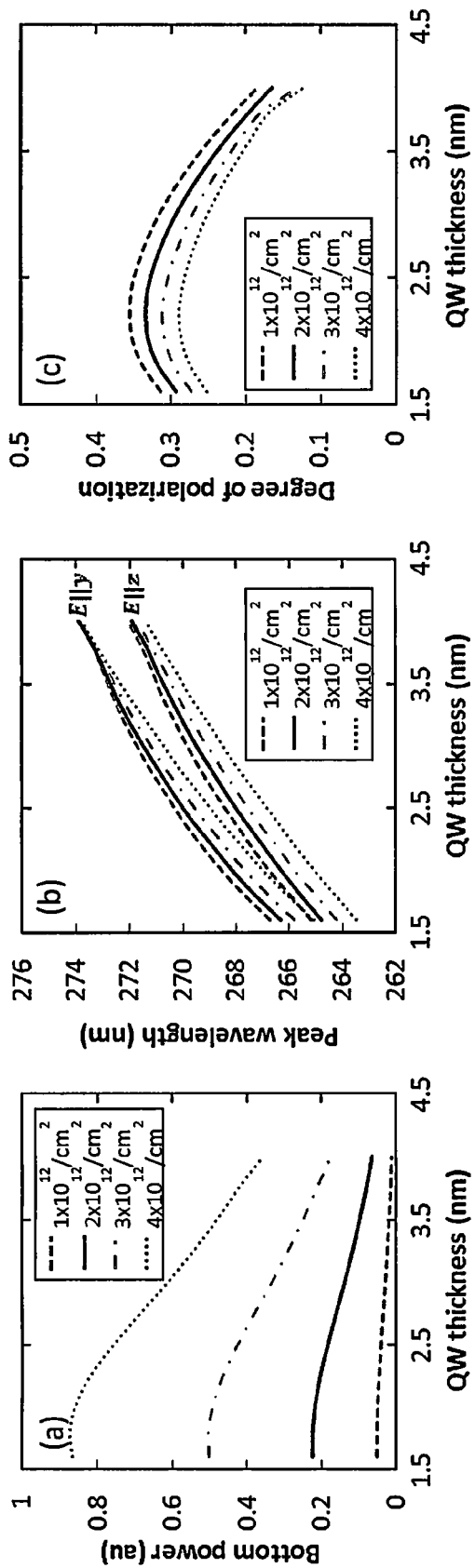
FIG. 10(a) is a graph of the bottom power.
FIG. 10(b) is a graph of the y polarized peak wavelength.
FIG. 10(c) is a graph of the degree of polarization versus quantum well thickness and the two-dimensional carrier density (varied from $1\times10^{12}$ to $4\times10^{12}$ cm$^{-2}$) of the theoretical data.

FIG. 10 shows the results of the calculation with plots of bottom power, wavelength, and degree of polarization versus QW thickness for direct comparison to FIG. 8. The experimentally observed decrease of bottom power, increase of peak wavelength, and decrease in degree of polarization shown in FIG. 8 agree well with the theoretical results shown in FIG. 10. Furthermore, the same trends in carrier density (current) are also observed. The plots of degree of polarization versus QW thickness and increased current density shown in FIG. 9(b) agree well with the simulations shown in FIG. 10(c). Clearly, the theoretical model is able to produce the same trends.

Figure 11:
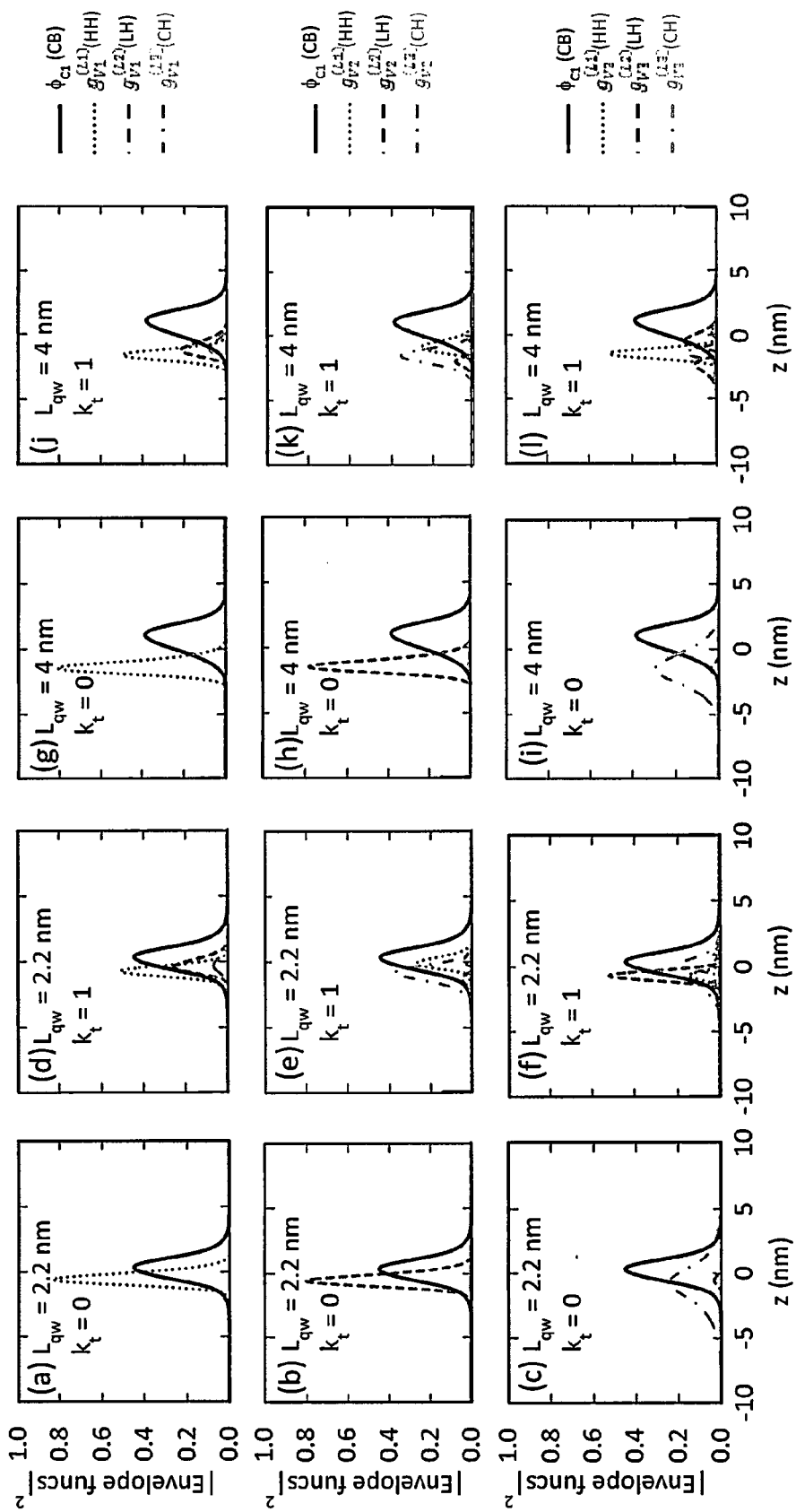
FIGS. 11(a)-(l) are graphs of the conduction and valence subband envelope functions for the (a)-(c) 2.2 nm thick QW at an in-plane wave vector of 0 nm$^{-1}$, (d)-(f) 2.2 nm thick QW at an in-plane wave vector of 1 nm$^{-1}$, (g)-(i) 4 nm thick QW at an in-plane wave vector of 0 nm$^{-1}$, and (j)-(l) 4 nm thick QW at an in-plane wave vector of 1 nm$^{-1}$. The first, second, and third highest valence subbands ($V_1$, $V_2$, and $V_3$) are in rows 1, 2, and 3, respectively.

Investigating the bandstructure and resulting envelope wave functions from the theoretical model allows for a deeper understanding the observed dependencies on QW thickness and carrier density. FIG. 11 shows the envelope functions of two different QW thicknesses ($L_{qw}$=2.2 nm and 4 nm) and in-plane wave vectors ($k_t$=0 nm$^{-1}$ and 1 nm$^{-1}$) separated by columns. The 1 nm$^{-1}$ is arbitrary chosen to explain trends with increased carrier bandfilling. The first, second, and third highest valence subbands ($V_1$, $V_2$, and $V_3$) are in rows 1, 2, and 3, respectively, with different mixtures of HH, LH, and CH envelope functions. Additionally, the matrix elements for light polarized in the y and z directions, i.e.

Figure 12:
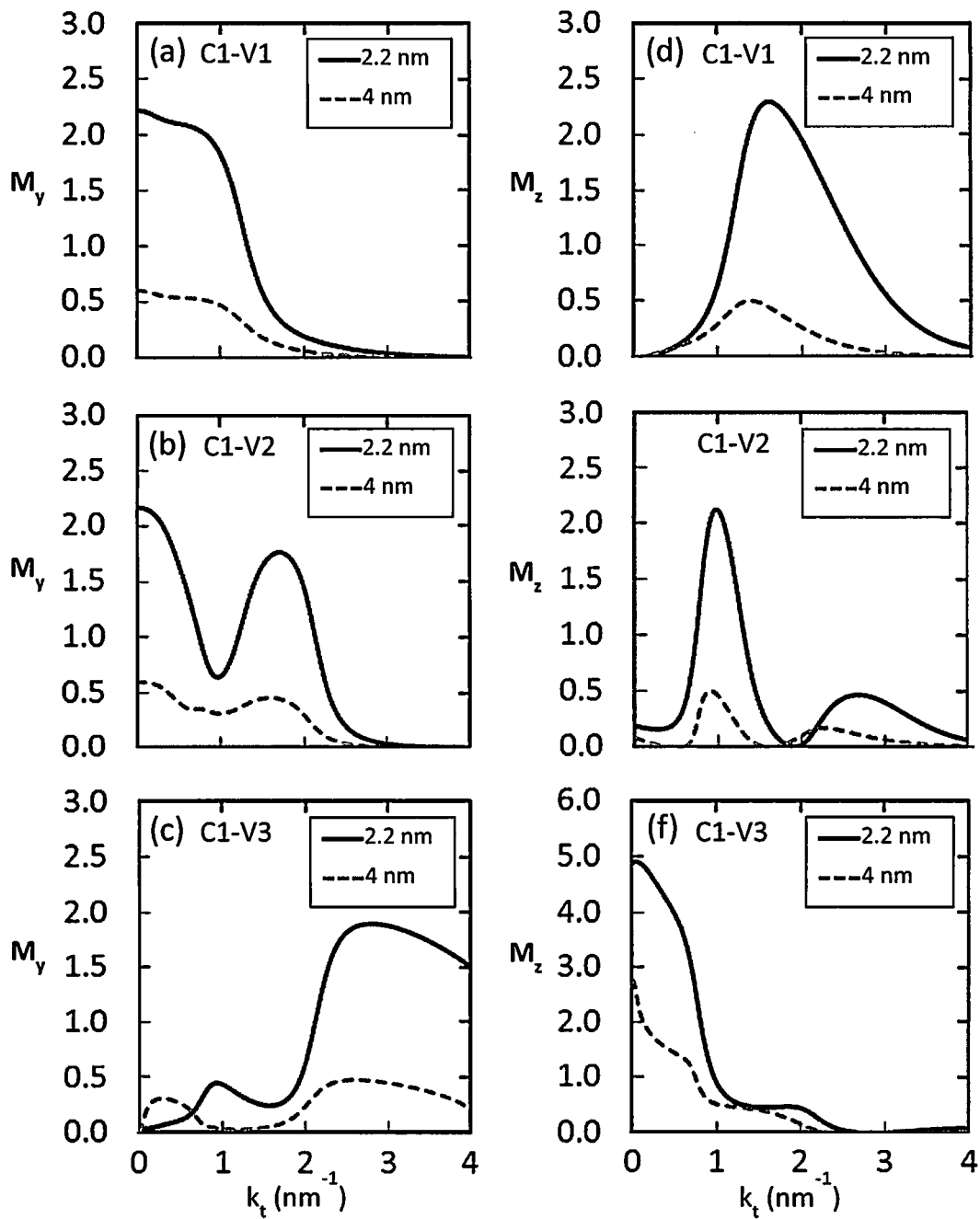
FIGS. 12(a)-(f) are graphs of the matrix elements for (a)-(c) y and (d)-(f) z polarized light for the three lowest ($V_1$, $V_2$, and $V_3$ in rows 1, 2, and 3) valence subbands.

$M_y=((\phi_n|g_m^{(O1)}>^2+<\phi_n|g_m^{O_2}>^2)P_1$ and $M_z=<\phi_n|g_m^{(O_3)}>^2P_2$, are shown in FIG. 12 versus $k_t$. Both FIGS. 11 and 12 are used to explain the theoretical data shown in FIG. 10.

First, to understand the trends of bottom power versus QW thickness (FIG. 10(a)), Eqs. (11) and (12) are simplified to approximate the total bottom emission ($\theta=180°$, i.e. q=qz)

$$g_{sp,E_{\theta=180°,\phi}}^{TM}(\omega)+g_{sp,E_{\theta=180°,\phi}}^{TE}(\omega) \propto (<\phi_n|g_m^{(O1)}>^2+ <\phi_n|g_m^{O_2}>^2)P_1 f_n^C(k_t)[1-f_{cm}^V(k_t)] \quad (18)$$

This equation shows that the bottom emission is directly dependent on the overlap between the conduction band envelope function $\phi_n$ and the valence subband envelope functions, $g_m^{(O1)}$ and $g_m^{(O2)}$. With increasing QW thickness, the spatial separation and hence overlap of the wave functions decreases for all three of the valence bands. This is due to the internal piezo- and pyro-electric fields present in the quantum well, which shift the wave functions farther apart with QW thickness. However, $V_1$ and $V_2$ are more localized compared to $V_3$, so they are more easily shifted by changes in the internal fields. This trend can be observed directly in FIG. 11 by comparing (a)-(c) to (g)-(i). The greater reduction in overlap of conduction band and HH and LH envelope functions with increased QW thickness results in lower bottom emission (Eq. (18)). Additionally, the impact of the decrease in wave function overlap can also be seen in the matrix elements shown in FIG. 12. The bottom light, if approximated at $\theta=180°$, is only polarized in the y direction and therefore described by the $m_y$ matrix element. FIGS. 12(a)-12(c) show $m_y$ for the 2.2 nm thick QW is larger than $M_y$ for the 4 nm thick QW for almost all in-plane wave vectors (except for near $k_t$=0 $nm^{-1}$ in the $C_1$-$V_3$ transition), and therefore the thinner QW should produce more bottom emission.

Since the bottom power is dependent on the degree of polarization they have the same trend with increasing QW thickness, and are also caused by the same changes in the valence subbands. Therefore changes in the spatial separation of valence subband envelop wave functions also impact the degree of polarization. The change in the degree of polarization on QW thickness can also be seen in the matrix elements in FIG. 12 when comparing the two highest valence bands near $k_t$=0. The difference in the matrix elements for 2.2 nm and 4 nm is much larger for the $M_y$ matrix element compared to the M. Therefore, there is a greater change in the y polarized light ($M_y$) compared to the z polarized light ($M_z$) with increasing QW thickness.

The peak wavelength shift shown in FIGS. 10(b) and 8(b) with increasing QW thickness is simply because the energy separation between the conduction band and the valence subbands decreases due to the decrease in confinement. This is true even without the presence of polarization fields within the quantum wells. The difference in wavelength between the different polarizations is illustrated in FIG. 11. In general, the LH and HH envelope functions which produce the $I_{E\|y}$ light dominate in the higher valence bands (smaller energy difference) while the CH envelope functions which produce the $I_{E\|z}$ light dominate at the lower energy bands (higher energy difference).

Finally, the decrease of the degree of polarization with increasing current density is a direct consequence of both a) increased hole population in the valence subbands and b) valence subband coupling. With increasing current density, the hole population in the valence subbands increases which allows more transitions to the second and third highest valence subbands ($V_2$ and $V_3$) and consequently an increase in $I_{E\|z}$ light. This can be easily seen in FIG. 11, where the CH envelope functions become more prevalent at the higher valence subbands. Additionally, population of states above $k_t$=0 yields a stronger increase in $I_{E\|z}$ light compared to the $I_{E\|y}$ light. As can be seen in FIGS. 11 and 12, the bandstructure and the resulting envelope functions and matrix elements have a strong $k_t$-dependence. At $k_t$=0, the highest valence subband ($V_t$) is decoupled from all other subbands and has HH character. In this case $M_y$ dominates, so transitions to the highest valence subband generate light that is predominantly $I_{E\|y}$. At higher $k_t$ however, the highest valence subband is increasingly coupled to lower LH and CH bands which allows emission of $I_{E\|z}$ light (higher $M_z$). With increasing carrier density, the holes increasingly occupy higher states above $k_t$=0 and transition to higher states in the valence band which allow for more emission of $I_{E\|z}$ light.

The present invention has been described as a tailored AlGaN quantum well for high extraction efficiency ultraviolet light-emitting diodes. It will be understood that the above description is merely illustrative of the applications of the principles of the present invention, the scope of which is to be determined by the claims viewed in light of the specification. Other variants and modifications of the invention will be apparent to those of skill in the art.

TABLE I

| Band structure parameters. | | |
| --- | --- | --- |
| Parameter | GaN | AlN |
| $\Delta_{cr} = \Delta_1$ [eV] | 0.010[a] | −0.169[c] |
| $\Delta_{so} = 3\Delta_2 = 3\Delta_3$ [eV] | 0.017[a] | 0.019[c] |
| $m_e^{z-}$ [m_0] | 0.20[a] | 0.30[a] |
| $m_e^t$ [m_0] | 0.21[a] | 0.32[a] |
| $A_1$ | −5.947[c] | −3.991[c] |
| $A_2$ | −0.528[c] | −0.311[c] |
| $A_3$ | 5.414[c] | 3.671[c] |
| $A_4$ | −2.512[c] | −1.147[c] |
| $A_5$ | −2.510[c] | −1.329[c] |
| $A_6$ | −4.6[c] | −1.952[c] |
| $D_1$ | 1.21[c] | −0.19[c] |
| $D_2$ | 4.32[c] | 7.61[c] |
| $D_3$ | 5.47[c] | 9.12[c] |
| $D_4$ | −2.98[c] | −3.79[c] |
| $C_{13}$ [GPa] | 98[c] | 112[c] |
| $C_{33}$ [GPa] | 403[c] | 372[c] |
| $C_{11}$ [GPa] | 366[c] | 397[c] |
| $C_{12}$ [GPa] | 139[c] | 143[c] |
| $P_{SP}$ [C/m²] | −0.034[a] | −0.09[a] |
| $e_{33}$ [C/m²] | 0.67[c] | 1.5[c] |
| $\epsilon[\epsilon_0]$ | 10.4[c] | 8.5[c] |
| VBO [eV] | −2.64[b] | −3.44[b] |
| $E_G$ [eV] at 300 K | 3.44[c] | 6.28[c] |
| $a_1$ ($a_1 = a_{cz} - D_1$) | −4.6[c] | −4.5[c] |
| $a_2$ ($a_2 = a_{ct} - D_2$) | −4.6[c] | −45.5[c] |
| a [Å] | 3.189[a] | 3.112[a] |

[a]I. Vurgaftman and J. R. Meyer, in *Nitride Semiconductor Devices: Principle and Simulations*, edited by J. Piprek (Wiley, New York, 2007), pp. 169.
[b]I. Vurgaftman et al., *J Appl Phys* 89, 5815 (2001).
[c]W. Bardyszewski and S. P. Lepkowski, *Phys Rev B* 85, 035318 (2012).

We claim:
1. An ultraviolet light-emitting diode, comprising;
a p-type structure comprised of AlGaN layers and an n-type structure comprised of AlGaN layers to form a p-n junction, and
a multiplicity of quantum wells disposed between the p- and n-type structures, wherein each quantum well comprises an AlGaN quantum well layer sandwiched between opposing AlGaN barrier layers, and wherein the quantum well layers are compressively strained and have an Al composition, a thickness, and a carrier density, and wherein the multiple quantum wells emit light with a degree of polarization that is greater than 0.3 so that it is preferentially polarized parallel to the plane of the quantum well layers.

2. The ultraviolet light-emitting diode of claim 1, wherein the multiplicity of quantum wells is grown with c-plane orientation.

3. The ultraviolet light-emitting diode of claim 1, wherein the multiplicity of quantum wells comprises three or more quantum wells.

4. The ultraviolet light-emitting diode of claim 3, wherein the multiplicity of quantum wells comprises six or more quantum wells.

5. The ultraviolet light-emitting diode of claim 1, wherein the Al composition of the quantum well layers is greater than 0.3.

6. The ultraviolet light-emitting diode of claim 1, wherein the Al composition of the quantum well layers is less than 0.8.

7. The ultraviolet light-emitting diode of claim 1, wherein the quantum well layers are compressively strained greater than 70% to AlN.

8. The ultraviolet light-emitting diode of claim 1, wherein the thickness of the quantum well layers is less than 2.9 nm.

9. The ultraviolet light-emitting diode of claim 1, wherein the Al composition of the quantum well layers is greater than 0.3 and the thickness of the quantum well layers is less than 2.5 nm.

10. The ultraviolet light-emitting diode of claim 1, wherein the barrier layers are thinner than 3.3 nm.

11. The ultraviolet light-emitting diode of claim 1, wherein the carrier density of the quantum well layers is less than $4 \times 10^{12}$ per $cm^2$.

12. The ultraviolet light-emitting diode of claim 1, wherein the thickness of the quantum well layers is less than 2.5 nm and the multiplicity of quantum wells comprises six or more quantum wells.

13. The ultraviolet light-emitting diode of claim 1, wherein the barrier layers are thinner than 2.9 nm and the multiplicity of quantum wells comprises six or more quantum wells.

14. The ultraviolet light-emitting diode of claim 1, wherein the Al composition of the quantum well layers is greater than 0.3, the thickness of the quantum well layers is less than 2.5 nm, the quantum well layers are compressively strained greater than 70% to AlN, and the multiplicity of quantum wells comprises six or more quantum wells.

* * * * *